United States Patent
Osada et al.

(10) Patent No.: US 9,985,038 B2
(45) Date of Patent: *May 29, 2018

(54) SEMICONDUCTOR INTEGRATED CIRCUIT DEVICE

(71) Applicant: Renesas Electronics Corporation, Koutou-ku, Tokyo (JP)

(72) Inventors: Kenichi Osada, Kawasaki (JP); Masataka Minami, Hino (JP); Shuji Ikeda, Koganei (JP); Koichiro Ishibashi, Warabi (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/448,585

(22) Filed: Mar. 2, 2017

(65) Prior Publication Data

US 2017/0179136 A1 Jun. 22, 2017

Related U.S. Application Data

(63) Continuation of application No. 15/216,327, filed on Jul. 21, 2016, now Pat. No. 9,646,678, which is a (Continued)

(30) Foreign Application Priority Data

May 12, 1999 (JP) ..................................... 11-130945
Apr. 27, 2000 (JP) ................................ 2000-132848

(51) Int. Cl.
*H01L 27/11* (2006.01)
*G11C 11/412* (2006.01)
(Continued)

(52) U.S. Cl.
CPC ........ *H01L 27/1104* (2013.01); *G11C 11/412* (2013.01); *G11C 11/417* (2013.01);
(Continued)

(58) Field of Classification Search
CPC .. H01L 27/1104; H01L 27/11; H01L 29/4916; H01L 29/783; G11C 11/412; G11C 11/417; Y10S 257/904
(Continued)

(56) References Cited

U.S. PATENT DOCUMENTS 5,072,286 A   12/1991 Minami et al.
5,166,902 A   11/1992 Silver
(Continued)

FOREIGN PATENT DOCUMENTS

JP   05090538   4/1993
JP   05235300   9/1993
(Continued)

OTHER PUBLICATIONS

Office Action dated Mar. 14, 2017 in Japanese Patent Application No. 2016-199209.
(Continued)

*Primary Examiner* — Ori Nadav
(74) *Attorney, Agent, or Firm* — Shapiro, Gabor and Rosenberger, PLLC

(57) ABSTRACT

Prior known static random access memory (SRAM) cells are required that a diffusion layer be bent into a key-like shape in order to make electrical contact with a substrate with a P-type well region formed therein, which would result in a decrease in asymmetry leading to occurrence of a problem as to the difficulty in micro-patterning. To avoid this problem, the P-type well region in which an inverter making up an SRAM cell is formed is subdivided into two portions, which are disposed on the opposite sides of an N-type well (Continued)

region NW1 and are formed so that a diffusion layer forming a transistor has no curvature while causing the layout direction to run in a direction parallel to well boundary lines and bit lines. At intermediate locations of an array, regions for use in supplying power to the substrate are formed in parallel to word lines in such a manner that one regions is provided per group of thirty two memory cell rows or sixty four cell rows.

10 Claims, 15 Drawing Sheets

Related U.S. Application Data continuation of application No. 14/752,514, filed on Jun. 26, 2015, now Pat. No. 9,449,678, which is a continuation of application No. 13/616,435, filed on Sep. 14, 2012, now Pat. No. 9,286,968, which is a continuation of application No. 12/821,329, filed on Jun. 23, 2010, now Pat. No. 8,482,083, which is a continuation of application No. 12/348,524, filed on Jan. 5, 2009, now Pat. No. 7,781,846, which is a continuation of application No. 11/042,172, filed on Jan. 26, 2005, now Pat. No. 7,612,417, which is a continuation of application No. 10/606,954, filed on Jun. 27, 2003, now abandoned, which is a continuation of application No. 09/565,535, filed on May 5, 2000, now Pat. No. 6,677,649.

(51) Int. Cl.
  *G11C 11/417* (2006.01)
  *H01L 29/49* (2006.01)
  *H01L 29/78* (2006.01)

(52) U.S. Cl.
  CPC .......... *H01L 27/11* (2013.01); *H01L 29/4916* (2013.01); *H01L 29/783* (2013.01); *Y10S 257/904* (2013.01)

(58) Field of Classification Search
  USPC ........................................................ 257/379
  See application file for complete search history.

(56) References Cited

U.S. PATENT DOCUMENTS

| | | | |
|---|---|---|---|
| 5,396,100 A | 3/1995 | Yamasaki et al. |
| 5,515,313 A | 5/1996 | Yamaguchi et al. |
| 5,594,270 A | 1/1997 | Hiramoto et al. |
| 5,654,572 A | 8/1997 | Kawase |
| 5,710,438 A | 1/1998 | Oda et al. |
| 5,744,844 A | 4/1998 | Higuchi |
| 5,780,328 A | 10/1998 | Fukuda et al. |
| 5,831,285 A | 11/1998 | Takeuchi et al. |
| 5,831,896 A | 11/1998 | Lattimore et al. |
| 5,841,690 A | 11/1998 | Shibutani et al. |
| 5,844,837 A | 12/1998 | Yoshikawa |
| 5,883,826 A | 3/1999 | Wendell et al. |
| 5,909,047 A | 6/1999 | Takahashi |
| 5,930,163 A | 7/1999 | Hara et al. |
| 5,965,922 A | 10/1999 | Matsui et al. |
| 5,966,324 A | 10/1999 | Wada et al. |
| 5,998,879 A | 12/1999 | Iwaki et al. |
| 6,118,158 A | 9/2000 | Kim |
| 6,147,385 A | 11/2000 | Kim et al. |
| 6,160,298 A | 12/2000 | Ohkubo et al. |
| 6,285,088 B1 | 9/2001 | Madan |
| 6,340,825 B1 | 1/2002 | Shibata et al. |
| 6,407,420 B1 | 6/2002 | Yamanaka et al. |
| 6,476,424 B1 | 11/2002 | Ishida |
| 7,214,963 B2 | 5/2007 | Choi et al. |

FOREIGN PATENT DOCUMENTS

| | | |
|---|---|---|
| JP | H06-188388 A | 7/1994 |
| JP | H06-291281 A | 10/1994 |
| JP | 07045704 | 2/1995 |
| JP | 07086436 | 3/1995 |
| JP | 07106438 | 4/1995 |
| JP | H07-161841 A | 6/1995 |
| JP | 08037241 | 2/1996 |
| JP | 08255842 | 10/1996 |
| JP | 09027552 | 1/1997 |
| JP | 9270468 | 10/1997 |
| JP | 09321152 | 12/1997 |
| JP | 10172287 | 6/1998 |
| JP | 10178110 | 6/1998 |
| JP | H10-223777 A | 8/1998 |
| JP | 11126827 | 5/1999 |
| JP | 2000174141 | 6/2000 |
| JP | 2000243858 | 8/2000 |
| KR | 1995023283 | 7/1995 |
| KR | 19960005602 | 2/1996 |
| KR | 998019133 | 8/1996 |
| KR | 19970067369 | 10/1997 |
| KR | 0142038 | 7/1998 |
| KR | 19994944 | 1/1999 |
| WO | WO 98/28795 A1 | 7/1998 |

OTHER PUBLICATIONS

Office Action dated May 30, 2017 in Japanese Patent Application No. 2017-028683.
Office Action in Japanese Counterpart Application H00008645 dated Jul. 27, 2014, 3 pages.
Japanese Office Action dated Nov. 26, 2015 in related JP Application No. 2014-161090, 5 pages.
Office Action dated Dec. 20, 2016 in Japanese Patent Application No. 2016-199209.
Office Action dated Aug. 9, 2016 in Japanese Patent Application No. 2015-180386.
Office Action dated Oct. 3, 2017 in Japanese Patent Application No. 2017-144172.

- ▨ DIFFUSION LAYER
- ☐ POLYSILICON LAYER
- ▧ CONTACT LAYER
- ◪ FIRST METAL LAYER
- ◪ FIRST VIA LAYER
- ☐ SECOND METAL LAYER
- ◪ SECOND VIA LAYER
- ⌐⌐ THIRD METAL LAYER

- ▨ DIFFUSION LAYER
- ☐ POLYSILICON LAYER
- ▩ CONTACT LAYER
- ▧ FIRST METAL LAYER
- ▨ FIRST VIA LAYER
- ☐ SECOND METAL LAYER
- ▨ SECOND VIA LAYER
- ⸨ ⸩ THIRD METAL LAYER
- ⊠ FIRST VIA LAYER, SECOND VIA LAYER, THIRD VIA LAYER
- ☐ FOURTH METAL LAYER

- ▨ DIFFUSION LAYER
- ▢ POLYSILICON LAYER
- ▦ CONTACT LAYER
- ◹ FIRST METAL LAYER
- ◩ FIRST VIA LAYER
- ▢ SECOND METAL LAYER
- ◺ SECOND VIA LAYER
- ⌐⌐ THIRD METAL LAYER
- ⌐ ⌐ AREA WHERE POLYSILICON AND
- ⌐ ⌐ DIFFUSION ARE CONNECTED

- ▨ DIFFUSION LAYER
- ▢ POLYSILICON LAYER
- ▩ CONTACT LAYER
- ▨ LOCAL INTERCONNECT
- ▨ FIRST METAL LAYER
- ▧ FIRST VIA LAYER
- ▢ SECOND METAL LAYER

SEMICONDUCTOR INTEGRATED CIRCUIT DEVICE

BACKGROUND OF THE INVENTION

The present invention relates generally to semiconductor integrated circuit devices and, more particularly, to layout schemes of static random access memory (SRAM) cells. The invention also relates to semiconductor memory devices using such cells.

One-port SRAM cells with complementary metal oxide semiconductor (CMOS) configurations are typically designed so that each cell consists essentially of six separate transistors. An exemplary layout of such cells has been disclosed in, for example, JP-A-10-178110 (laid open on Jun. 30, 1998).

In the prior known SRAM cell layout, a semiconductive well region of P type conductivity with inverters formed therein is subdivided into two subregions, which are disposed on the opposite sides of an N-type well region while permitting a well boundary line to extend in a direction parallel to bit lines.

The quest for higher integration and ultra-fine patterning techniques in modern memory devices requires optical exposure apparatus or equipment to decrease in wave length of beams used therein. To this end, the equipment is designed to employ exposure beams of shorter wavelength, which have advanced from G line to I line, and further to excimer laser. Unfortunately the requirements for micropatterning architectures grows more rapidly than technological advance in trend of shortening wavelengths in such equipment. In recent years, it is strictly required that micropatterning is done with the minimum device-feature length that shrinks to less than or equal to the wavelength of an exposure beam used. This minimum feature length shrinkage would result in the layout of IC components—here, memory cells—becoming more complicated in planar shape, which must require the use of irregular polygonal layout patterns including key-shaped components, in order to achieve the intended configuration of on-chip circuitry with enhanced accuracy. This makes it impossible or at least very difficult to microfabricate ultrafine layout patterns while disadvantageously serving as the cause of destruction of the symmetry of memory cells.

Regrettably the prior art approach is associated with a need to curve or bend a diffusion layer into a complicated key-like shape for the purpose of making electrical contact with a substrate of the P-type well region. Thus, the prior art suffers from a problem as to degradation of the symmetrization of cell layout pattern, making difficult successful achievement of microfabrication architectures for higher integration densities.

SUMMARY OF THE INVENTION

In accordance with one aspect of the present invention, a semiconductor device is provided which comprises a first inverter including a first N-channel metal oxide semiconductor (MOS) transistor and a first P-channel MOS transistor, a second inverter including a second N-channel MOS transistor and a second P-channel MOS transistor with an input terminal being connected to an output terminal of the first inverter and with an output terminal being connected to an input terminal of said first inverter, a third N-channel MOS transistor having a source connected to the output terminal of said first inverter and a drain connected to a first bit line and also a gate connected to a word line, and a fourth N-channel MOS transistor having a source connected to the output terminal of said second inverter and a drain connected to a second bit line plus a gate connected to a word line, wherein the first and third N-channel MOS transistors are formed in a first P-type well region, wherein the diffusion layer has no curved or bent portions while letting the direction of layout be parallel to the boundary with respect to the first N-well region with the first and second P-channel MOS transistors formed therein, and wherein said second and fourth N-channel MOS transistors are formed in the second P-type well region whose diffusion layer has no bent portions while letting the layout direction be parallel to the boundary with respect to the first N-well region with the first and second P-channel MOS transistors formed therein.

The diffusion layer is arranged to have its outer shape that mainly consists of straight line segments including the longest straight line portion which lies parallel to the boundary with respect to the first n-well region with the first and second P-channel MOS transistors formed therein, and simultaneously in the case of defining a straight line acting as the center line extending parallel to such boundary, the longest line portion is in linear symmetry with such center line; the second and fourth N-channel MOS transistors are formed in the second P-well region whose diffusion layer is mainly arranged by straight line segments including its longest straight line portion that is parallel to the boundary with respect to the first n-well region with the first and second P-channel MOS transistors formed therein while allowing, when defining a straight line for use as the center line extending parallel to such boundary, the line portion to be linearly symmetrical with the center line. At this time, in the case of employing the linear symmetrization scheme, complete linear symmetry will not always be required; alternatively, slight nonsymmetry may also be permissible on a case-by-case basis, which nonsymmetry results from modifying the diffusion layer to have a shape with its portions on the right and left sides of the center line being substantially the same in area as each other by way of example.

In accordance with another aspect of this invention, a first polycrystalline silicon lead layer for use as the gate of said third N-channel MOS transistor and a second polycrystalline silicon lead layer for use as the gate of said first P-channel MOS transistor and also as the gate of said first N-channel MOS transistor are disposed in parallel to each other, wherein a third polycrystalline silicon lead layer for use as the gate of said fourth N-channel MOS transistor and a fourth polycrystalline silicon lead layer for use as the gate of said second N-channel MOS transistor and also as the gate of said second P-channel MOS transistor are disposed in parallel to each other, and wherein the first and third polycrystalline silicon lead layers are connected via a contact to a second layer of metal lead layer constituting word lines.

In accordance with a further aspect of the invention, the input terminal of said first inverter and the output terminal of said second inverter may be electrically connected together at a contact whereas the input terminal of said second inverter and the output terminal of said first inverter are electrically connected together at a contact.

In accordance with yet another further aspect of the invention, a power supply line connected to the first and second bit lines and the sources of said first and second P-channel MOS transistors and a ground line connected to the sources of said first and second N-channel MOS transistors may be formed of a third layer of metal lead layer lying parallel to a diffusion layer. In accordance with a still another aspect of the invention, the first bit line formed of said third layer of metal lead layer may be arranged so that it is between a power supply line formed of said third layer of metal lead layer and a ground line as connected to the source of said first N-channel MOS transistor formed of said third layer of metal lead layer whereas the second bit line formed of said third layer of metal lead layer is between a power supply line formed of said third layer of metal lead layer and a ground line as connected to the source of said second N-channel MOS transistor formed of said third layer of metal lead layer.

In accordance with another further aspect of the invention, the first and second bit lines and a power supply line connected to the sources of said first and second P-channel MOS transistors may be formed of a second layer of metal lead layer, wherein word lines are formed of a third layer of metal lead layer, and wherein a ground line connected to the sources of said first and second N-channel MOS transistors is formed of the third layer and second layer of metal lead layer.

In accordance with a still another further aspect of the invention, memory cells are laid out into the form of an array, wherein contacts to a substrate of P-type well region and a contact to a substrate of N-type well region are linearly disposed within the array and at upper and lower portions of the array in a direction parallel to the word lines. Although the above is an example which causes two separate P-well to be disposed on the opposite sides of an N-well region, two N-well regions may be disposed on the opposite sides of a p-well region when the need arises.

In accordance with yet another further aspect of the invention, a semiconductor device is provided which comprises a plurality of memory arrays each including an array of memory cells each having at least a pair of N-type well region and P-type well region, and at least one intermediate region between the memory arrays, wherein the N-type well region and P-type well region defines therebetween a boundary with at least one straight line portion, and wherein a diffusion layer is formed in each of the P-type well region and P-type well region to have a planar shape of either (1) a shape of rectangle having long sides extending parallel to said straight line portion or (2) a shape resulting from letting a plurality of rectangles having long sides extending parallel to the straight line portion be combined together via respective short sides thereof; or alternatively, (1) a shape of rectangle having long sides parallel to said straight line portion or (2) a shape resulting from letting a plurality of rectangles having long sides parallel to said straight line portion be combined together causing them to extend in the direction of the straight line.

At least in memory array regions, bit lines are laid out in a direction parallel to the straight line portion whereas word lines are disposed in a direction perpendicular to the straight portion. Preferably, in the intermediate region, at least one type of electrical lead is railed in a direction at right angles to the straight portion, and a lead (e.g. contact) is also formed which is for making electrical contact between a power supply voltage lead and the diffusion layer as formed in the N-well region or P-well region. This lead may include a power supply lead, ground lead, or other potential leads.

The invention is particularly useful for those semiconductor memory devices having static RAM memory cells each consisting essentially of six separate transistors.

DETAILED DESCRIPTION OF EMBODIMENTS

Several preferred embodiments of the semiconductor memory device in accordance with the present invention will be explained with reference to the accompanying drawings below.

Embodiment 1

Figure 1:
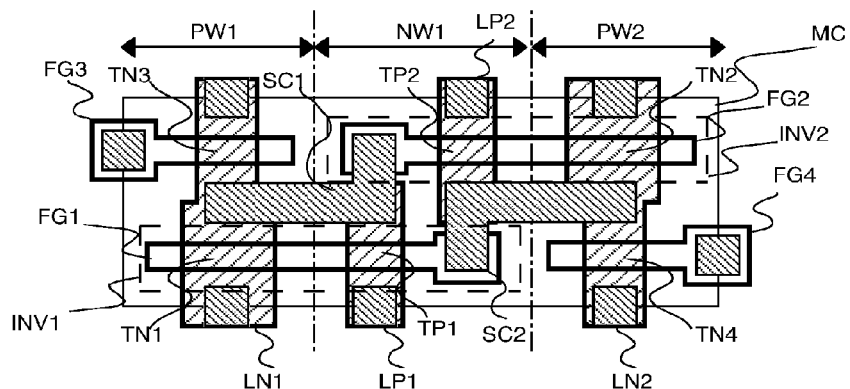
FIG. 1 is a diagram showing an SRAM cell in accordance with Embodiment 1 of the present invention, for explanation of a layout pattern of those contacts for connection between MOS transistors and those for connecting between MOS transistors and metal lead layers.
Figure 2:
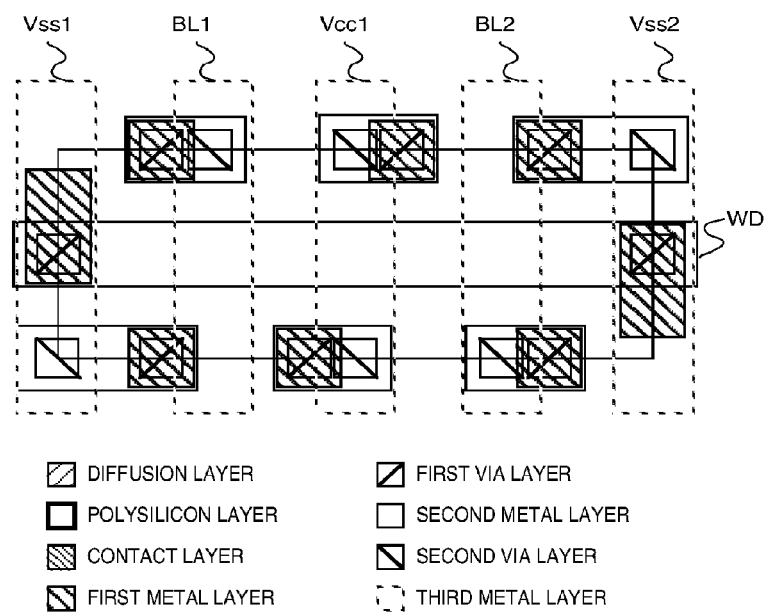
FIG. 2 is a diagram showing a layout of via holes of SRAM cells for connection between multilayered metal leads in accordance with Embodiment 1 of this invention.

Referring to FIGS. 1 and 2, there is shown an SRAM cell layout MC embodying the invention. FIG. 1 illustrates well regions and diffusion layers plus polycrystalline silicon interconnect lead layer as well as contacts, all of which are formed in or over a semiconductor substrate whereas FIG. 2 depicts a first layer of metal lead layer, via holes 1, second layer of metal lead layer, via holes 2, and a third layer of metal lead layer. Symbols used in FIGS. 1 and 2 are indicated at lower part of FIG. 2.

An N-channel type MOS transistor TN1 formed in a P-type semiconductive well region PW1 and a P-channel type MOS transistor TP1 formed in an N-type well region NW1 constitute an inverter INV1. In addition, an N-channel MOS transistor TN2 formed in P-type well region PW2 and a P-channel MOS transistor TP2 formed in N-type well region NW1 constitute an inverter INV2.

An output node of the inverter INV1 is electrically connected by a contact SC1 to an input node of the inverter INV2. An output of the inverter INV2 is electrically connected via a contact SC2 to an input of the inverter INV1.

An N-channel MOS transistor TN3 has a drain electrode connected to a bit line BL1, a source electrode connected to a drain of the N-channel MOS transistor TN1, and a gate electrode connected to a word line WD. Similarly an N-channel MOS transistor TN4 has a drain electrode connected to a bit line BL2, a source electrode connected to a drain of the N-channel MOS transistor TN2, and a gate electrode connected to word line WD.

The N-channel MOS transistor TN1 and N-channel MOS transistor TN3 are formed over a diffusion layer LN1 whereas the N-channel MOS transistor TN2 and N-channel MOS transistor TN4 are formed over a diffusion layer LN2. The P-channel MOS transistor TP1 is formed over a diffusion layer LP1 whereas the P-channel MOS transistor TP2 is formed over a diffusion layer LP2.

As the diffusion layers (LN1, LN2, LP1, LP2) are straight lines with no curved portions, any pattern correction at folded portions is no longer necessary, resulting in the balance between nodes being improved. In case memory cells are laid out into the form of an array, the diffusion layers become four separate straight lines extending parallel to the bit lines (BL1, BL2).

In addition, a polycrystalline silicon interconnect lead layer FG3 for use as the gate electrode of the N-channel MOS transistor TN3 and a polycrystalline silicon lead layer FG4 for use as the gate electrode of N-channel MOS transistor TN4 are connected to word lines WL which are formed of the second metal lead layer in a vertical direction to the bit lines (BL1, BL2). A polycrystalline silicon interconnect lead layer FG1 for use as the gate electrodes of the N-channel MOS transistor TN1 and P-channel MOS transistor TP1 and a polycrystalline silicon interconnect lead layer FG2 for use as the gate electrode of the N-channel MOS transistor TN2 and P-channel MOS transistor TP2 plus the polycrystalline silicon lead layers (FG3, FG4) are disposed in parallel to the word lines.

The N-channel MOS transistor TN1 has its source electrode connected to a ground potential line Vss1 that is formed of the third layer of metal lead layer whereas a source electrode of the N-channel MOS transistor TN2 is connected to a ground line Vss2 as formed of the third layer of metal lead layer. In addition, source electrodes of the P-channel MOS transistors (TP1, TP2) are connected to a power supply voltage line Vcc1 which is formed of the third layer of metal lead layer.

The bit line BL1 is located midway between the power supply voltage line Vcc1 and ground line Vss1 whereas bit line BL2 is between the supply voltage line Vcc1 and ground line Vss2. This structure makes it possible to reduce cross-couple noises occurring between bit lines, which advantageously lowers voltages while increasing operation speeds.

In addition, it is considered that, in case a contact is formed on an $n^-$ layer through partial cutaway of side spacers during etching of contact holes, a leakage current from the contact via the $n^-$ layer to the substrate may be produced. When a contact is formed for connection between a polycrystalline silicon lead layer and a diffusion layer, a distance between the diffusion layer LP2 and polycrystalline silicon lead layer FG1 should be greater than the length of a side spacer to thereby eliminate formation an $n^-$ layer on the polycrystalline silicon lead layer FG1 side of the diffusion layer LP2, which in turn makes it possible to prevent a flow of leakage current.

Embodiment 2

Figure 3:
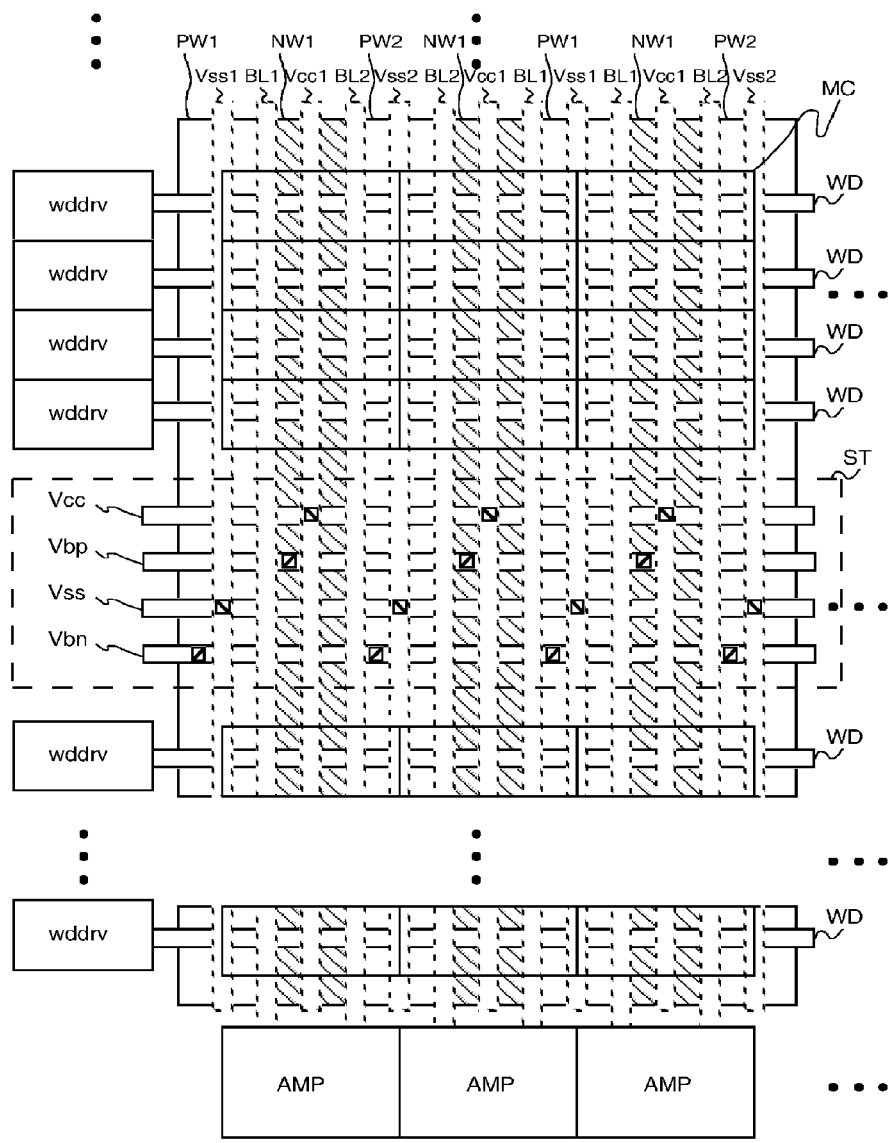
FIG. 3 is a diagram showing a layout of memory cells and their associated peripheral circuitry in accordance with Embodiment 2 of the invention.

Turning to FIG. 3, there is shown an exemplary case where the memory cells MC of Embodiment 1 are laid out into the form of an array. Symbols used herein are the same as those indicated at lower part of FIG. 2.

The memory cells MC are organized into an array of 256 rows and 128 columns, by way of example. In view of the fact that these memory cells in Embodiment 1 are less in length in the longitudinal direction of bit lines, a total length of such 256 rows of memory cells along the bit lines is shorter than that of prior art devices, thus increasing resultant operation speeds. Neighboring memory cells MC are disposed in linear symmetry with respect to a "y" axis whereas upper and lower adjacent memory cells MC are in linear symmetry with an "x" axis. In addition, specified regions ST for use in supplying more than one power supply voltage to the substrate are formed at intermediate part of the array in such a manner that the regions ST extend parallel to word lines WD. One example is that the regions ST are laid out in units of 32-row groups. Another example is that regions ST are disposed in units of 64-row groups.

An electrical lead Vbn for supplying a voltage potential to the P-well regions (PW1, PW2) and a lead Vbp for supplying a voltage to the N-well region NW1 are formed to lie parallel to word lines. The lead Vbn may be coupled to ground potential Vss or, alternatively, any voltage may be applied thereto which is potentially different from ground Vss. The lead Vbp may be coupled to the power supply voltage Vcc or, alternatively, any voltages potentially different from Vcc may be applied thereto.

Note that in each region ST, a power supply voltage line Vcc for potentially "reinforcing" a power supply voltage line Vcc1 is formed in parallel to word lines while letting a ground potential line Vss for potentially reinforcing ground potentials (Vss1, Vss2) is formed in parallel to the word lines.

Also note that the ground lines (Vss1, Vss2) are disposed in a direction perpendicular to the word lines WD whereby upon selecting of a single word line a voltage potential is supplied from the pair of ground lines to a respective one of those memory cells operatively associated with this selected word line so that any possible noises occurring at such voltage lines are reduced to thereby advantageously speed up an access operation while potentially reducing any voltages concerned.

Furthermore, the memory cells MC used are great in width in the word line direction so that the layout design of sense amplifiers AMP is made easier to thereby avoid a need to lay out one sense amplifier for two adjacent columns of memory cells, which in turn makes it possible to permit one sense amplifier to be laid out at each column. Additionally a word line driver circuit wddrv becomes flat in layout as compared to prior known ones.

Embodiment 3

Figure 4:
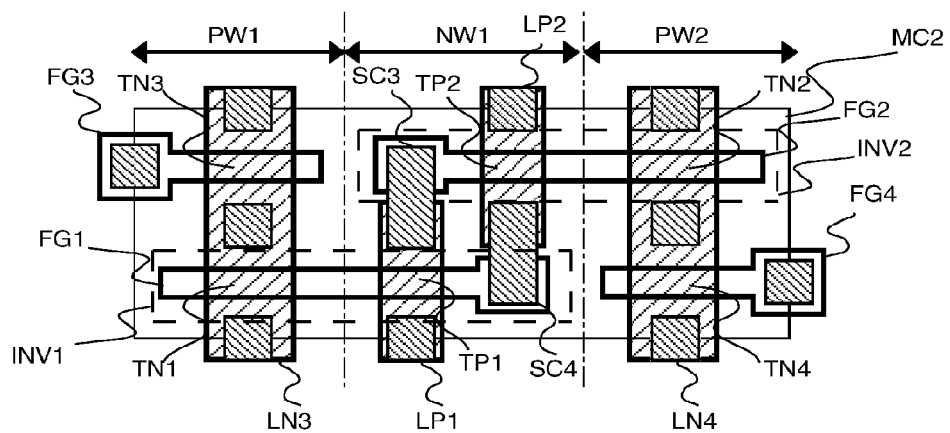
FIG. 4 is a diagram showing an SRAM cell in accordance with Embodiment 3 of the invention, for explanation of a layout of those contacts for connection between MOS transistors and those for connection between MOS transistor and metal lead layers.
Figure 5:
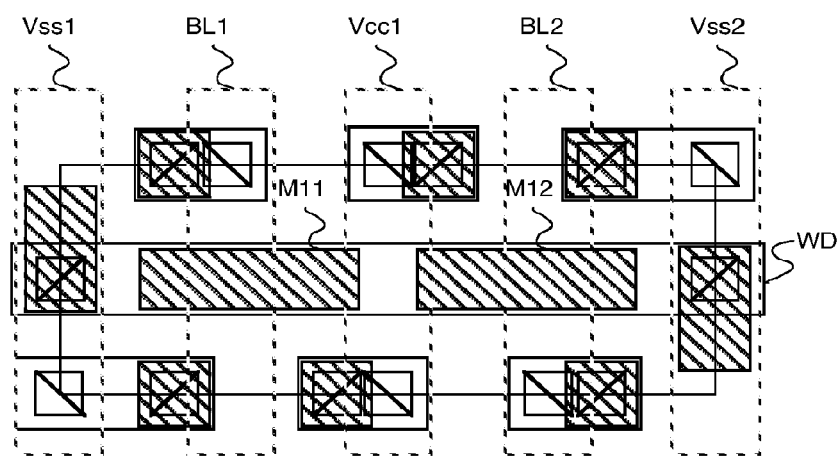
FIG. 5 is a diagram showing a layout of via holes of SRAM cells for connection between multilayered metal leads in accordance with Embodiment 3 of the invention.

FIGS. 4 and 5 show a SRAM cell layout MC2 in accordance with Embodiment 3. Symbols as used in FIGS. 4-5 are the same as those in FIG. 2. Memory cell MC2 of Embodiment 3 is similar to the memory cell MC of Embodiment 1, except that whereas in Embodiment 1 the diffusion layer (LN1, LN2) is formed into a "T"-like planar shape, which resembles a Japanese battledore plate called "hagoita," the diffusion layer (LN3, LN4) of Embodiment 4 is of a rectangular shape, and that the contacts (SC1, SC2) are replaced with contacts (SC3, SC4) in the first layer of metal lead layers (M11, M12).

To attain stability, memory cells are typically designed so that the gate width of N-channel MOS transistors (TN1, TN2) is one and a half times greater than that of N-channel MOS transistors (TN3, TN4). However, in this case, the shape of diffusion layers resembles a T-like planar shape as has been shown in Embodiment 1, which in turn requires extra techniques including pattern correction procedures such as optical proximity effect correction (OPC) processes. Additionally this would result in degradation of the balance between transistors. In contrast, Embodiment 3 is such that the diffusion layers (LN3, LN4) are designed to have a rectangular shape whereby the micro-patterning required becomes easier while at the same time enabling improvement in balance between transistors. Note however that the resultant gate width ratio becomes as large as 1.0 time, which in turn requires that the so-called cell ratio be increased by making different drivabilities therebetween, which is achievable by letting the N-channel MOS transistors (TN3, TN4) be greater in oxide film thickness than N-channel MOS transistors (TN1, TN2), or by increasing the gate length thereof, or alternatively by increasing the threshold value, or still alternatively by lowering the impurity concentration of lightly-doped drain regions for relaxation of electric fields.

In addition, Embodiment 3 is arranged to employ a contact SC3 and a first layer of metal lead layer M11 in place of the contact SC1 used in Embodiment 1 for connection between the output of inverter INV1 and the input of inverter INV2. With such an arrangement, any curved or bent contacts are no longer necessary, thereby avoiding the need for pattern correction (OPC) or the like.

Embodiment 4

Figure 6:
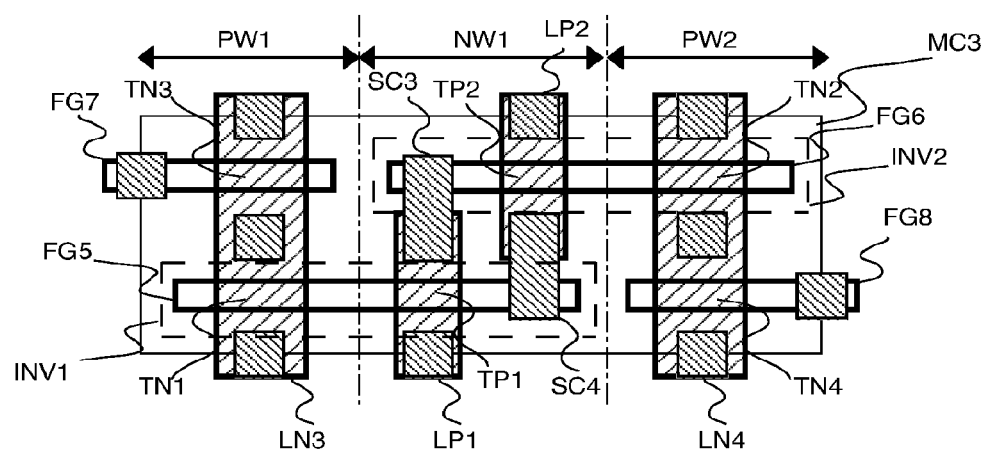
FIG. 6 is a diagram showing an SRAM cell in accordance with Embodiment 4 of the invention, for explanation of a layout of those contacts for connection between MOS transistors and those for connection between MOS transistors and metal lead layers.
Figure 7:
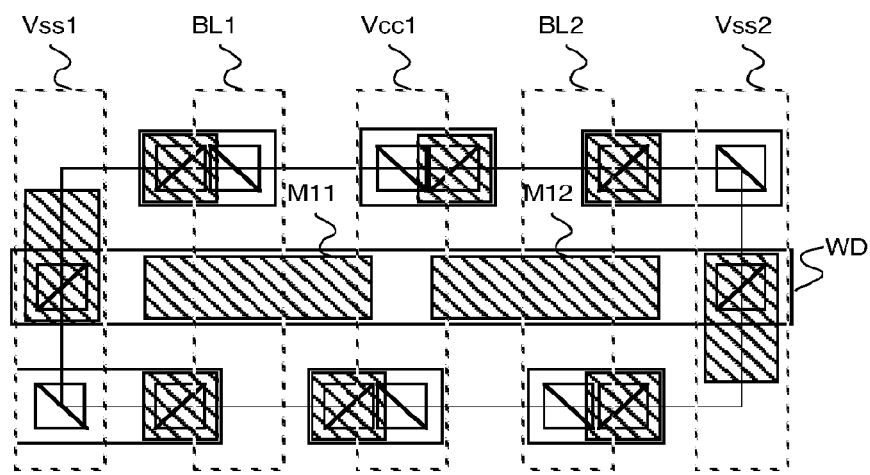
FIG. 7 is a diagram showing a layout of via holes of SRAM cells for connection between multilayered metal leads in accordance with Embodiment 3 of the invention.

FIGS. 6 and 7 show an SRAM cell layout MC3 in accordance with an embodiment 4. Symbols as used in FIGS. 6-7 are the same as those in FIG. 2. Memory cell MC3 of Embodiment 4 is similar to the memory cell MC2 of Embodiment 3 except that polycrystalline silicon lead layers (FG5, FG6, FG7, FG8) are designed to have a rectangular planar shape. With this cell, any bent/folded portions are absent thus removing the need for any additional pattern correction procedures including OPC processes, which in turn improves the balance between transistors.

Embodiment 5

Figure 8:
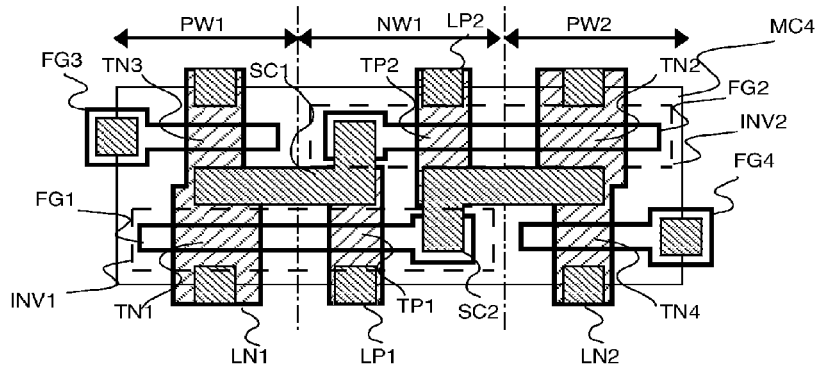
FIG. 8 is a diagram showing an SRAM cell in accordance with Embodiment 5 of the invention, for explanation of a layout of those contacts for connection between MOS transistors and those for connection between MOS transistors and metal lead layers.
Figure 9:
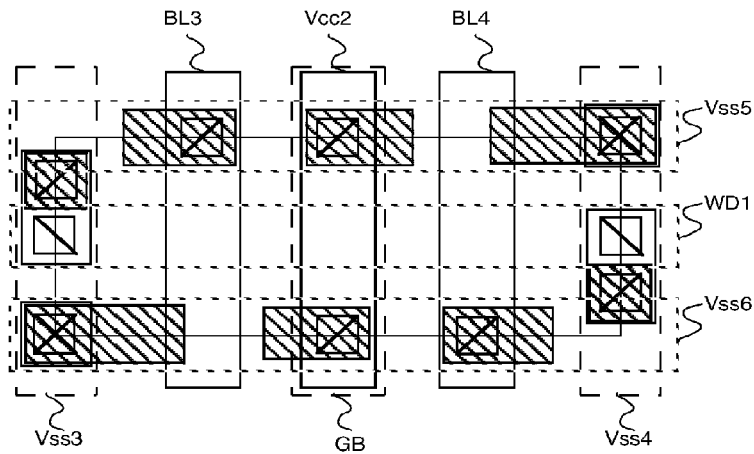
FIG. 9 is a diagram showing a layout of via holes of SRAM cells for connection between multilayered metal leads in accordance with Embodiment 5 of the invention.

FIGS. 8 and 9 show an SRAM cell layout MC4 in accordance with Embodiment 5. An explanation on those symbols used in FIGS. 8 and 9 is given at lower part of FIG. 8. Memory cell MC4 of Embodiment 5 is different in lead structure from the memory cell MC of Embodiment 1.

Bit lines (BL3, BL4) and power supply line Vcc2 are formed by use of a second layer of metal lead layer. A word line WD1 and ground lines (Vss5, Vss6) are formed using a third layer of metal lead layer in a perpendicular direction to the bit lines. Ground lines (Vss3, Vss4) are formed using a fourth layer of metal lead layer in a direction parallel to the bit lines.

A global bit line GB is the electrical interconnect lead that is used in case bit lines are of a hierarchical configuration. The global bit line GB and bit lines (BL3, BL4) are shielded by the third layer of metal lead layer, thus enabling prevention of any possible cross-couple noises. Additionally the use of ground lines (Vss3, Vss4) makes it possible to prevent occurrence of cross-couple noises between global bit lines GB.

Embodiment 6

Figure 10:
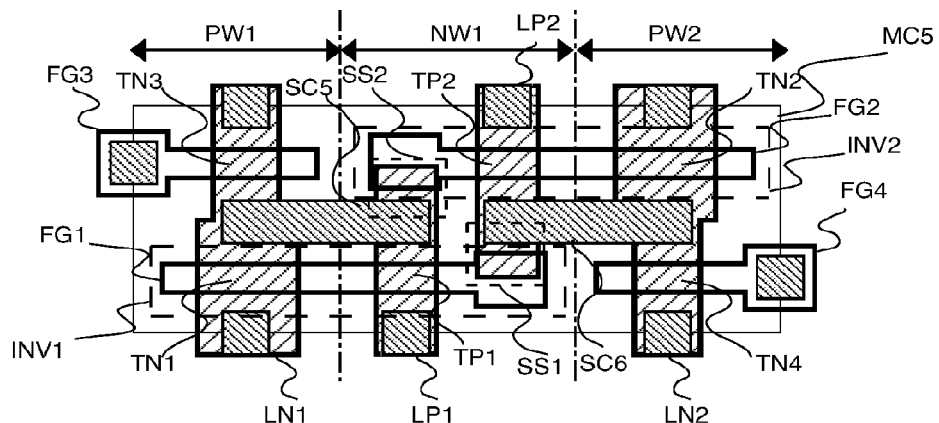
FIG. 10 is a diagram showing an SRAM cell in accordance with Embodiment 6 of the invention, for explanation of a layout of those contacts for connection between MOS transistors and those for connection between MOS transistors and metal lead layers.
Figure 11:
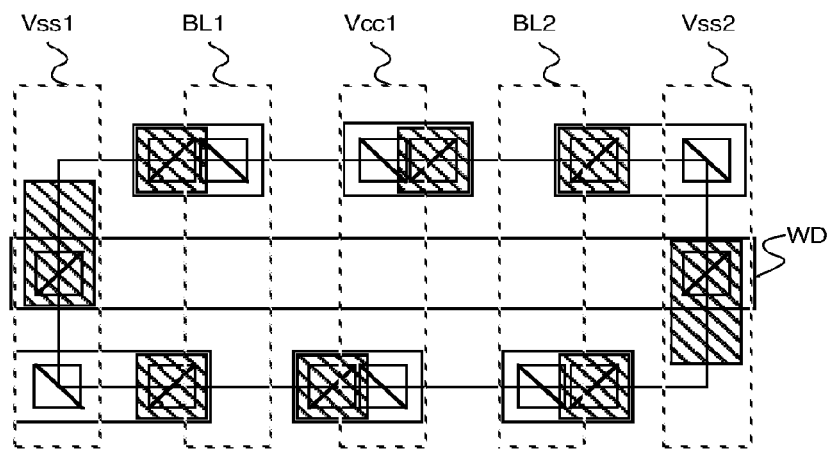
FIG. 11 is a diagram showing a layout of via holes of SRAM cells for connection between multilayered metal leads in accordance with Embodiment 6 of the invention.

FIGS. 10 and 11 show an SRAM cell layout MC5 in accordance with an embodiment 6. An explanation as to those symbols used in FIGS. 10-11 is given at lower part of FIG. 11. Memory cell MC5 of Embodiment 6 is different from the memory cell MC of Embodiment 1 in structure of the so-called three-layered contacts, each of which is for connection between a gate electrode and its associated diffusion layer.

Although in Embodiment 1 a gate electrode is connected to a diffusion layer via "L"-like contacts SC1, SC2, Embodiment 6 is arranged so that the gate electrode is connected to the diffusion layer via silicide in connect regions SS1, SS2. This makes it unnecessary to bend or curve the individual contact into the L-like shape in order to connect the gate electrode to the diffusion layer, which in turn makes it possible to provide "I"-like rectangular contacts SC5, SC6. No folded/bent portions are present in the contacts used, which eliminates the need for pattern correction (OPC).

One practically implementable flow of some major process steps in the manufacture of a device structure employing the connect regions SS1, SS2 each for connection between a gate electrode and a diffusion layer associated therewith via silicide is shown in FIGS. 12a through 12f. Note here that FIGS. 12a-12f are cross-sectional views each indicating a profile as taken along line A-A' in FIG. 10, with its right side corresponding to the side "A" and with left side corresponding to "A'."

Figure 12A:
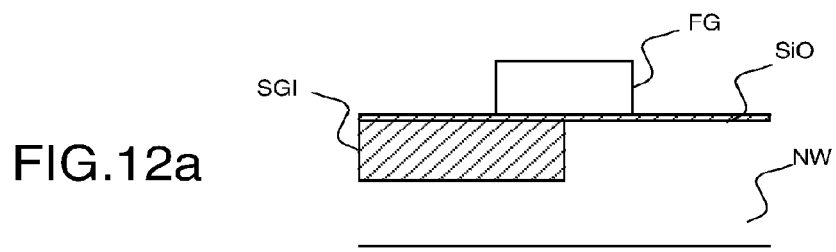
FIGS. 12a to 12f are diagrams illustrating in cross-section some of major process steps in the manufacture of the semiconductor device in accordance with Embodiment 6 of the invention.

Fabricate a gate electrode FG made of a chosen polycrystalline silicon material (see FIG. 12a).

Figure 12B:
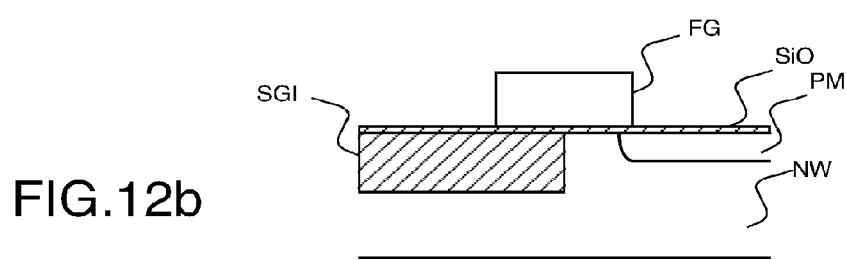

Form a heavily-doped diffusion layer PM of a specified conductivity type—here, P type (FIG. 12b).

Figure 12C:
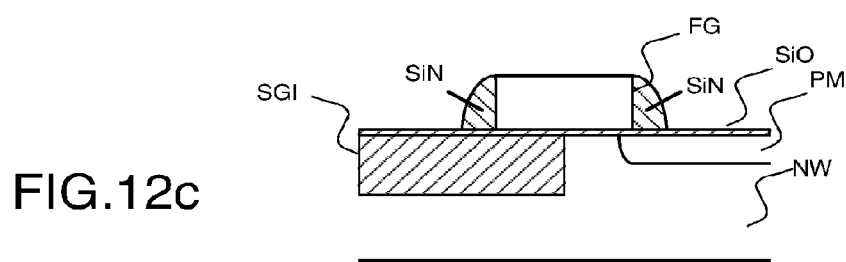

Form side spacers made of silicon nitride (SiN) by chemical vapor deposition (CVD) techniques, on sidewalls of the resultant gate electrode FG (FIG. 12c).

Figure 12D:
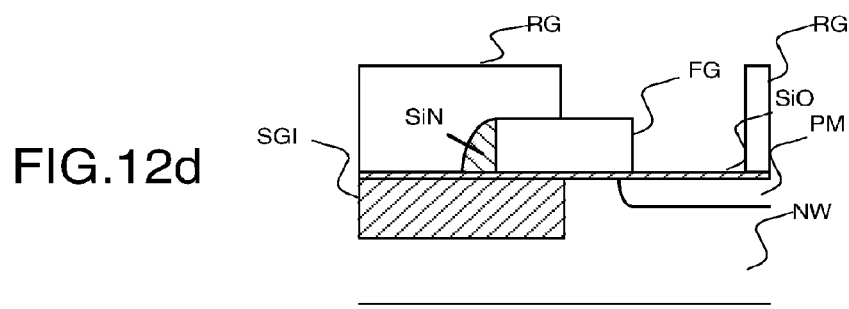
Figure 12E:
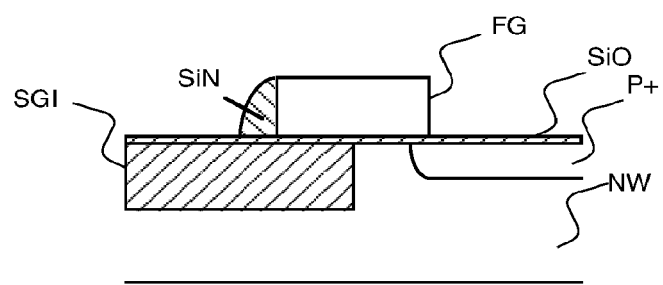

Make use of a resist RG to etch away only one of the SiN side spacers which resides on an active region side under a prespecified condition that enables etching treatment of a silicon nitride film and oxide film at increased selectivity (FIG. 12d).

Fabricate a heavily-doped P (P+) type diffusion layer P+.

Figure 12F:
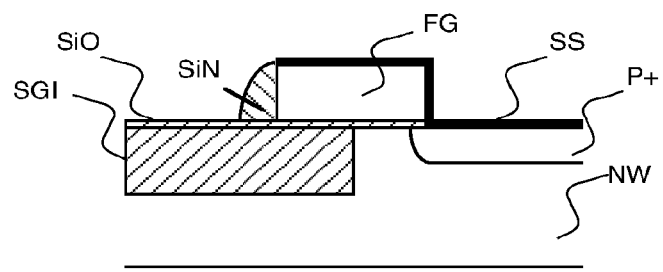

After having removed through etching certain part of the oxide film SiO that lies in the active region that is not covered by any overlying gate electrode FG, deposit a high-melting-point metal such as refractory metal including, but not limited to, cobalt (Co); then, anneal the resultant structure to thereby selectively form silicide on the polysilicon gate electrode and diffusion layer (FIG. 12f). At this time the gate electrode's sidewall and diffusion layer are connected together by such silicide.

Embodiment 7

Figure 13:
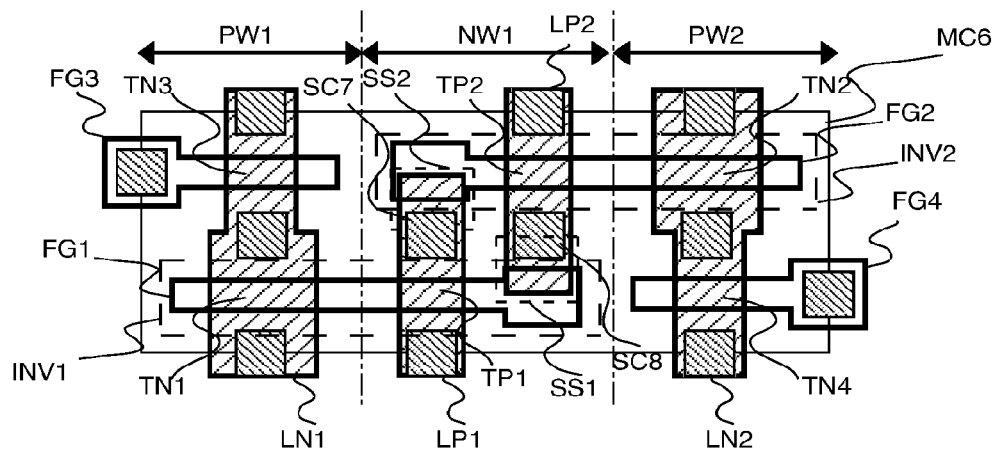
FIG. 13 is a diagram showing an SRAM cell in accordance with Embodiment 7 of the invention, for explanation of a layout of those contacts for connection between MOS transistors and those for connection between MOS transistors and metal lead layers.
Figure 14:
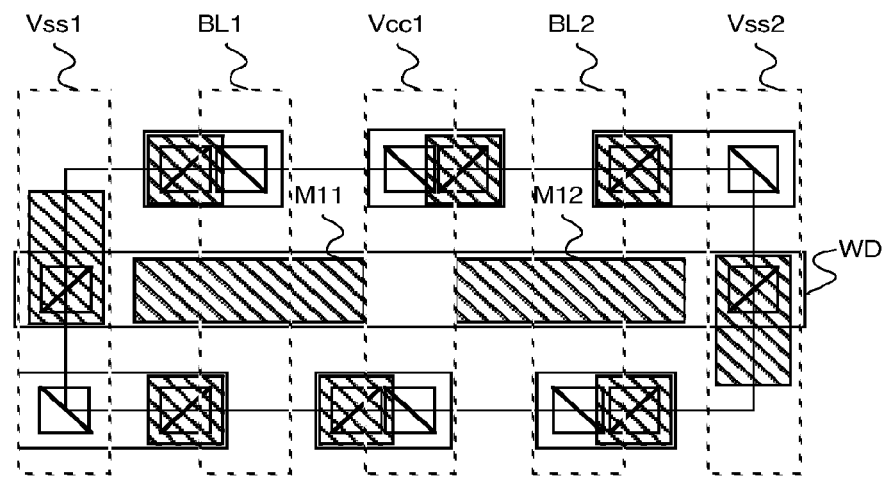
FIG. 14 is a diagram showing a layout of via holes of SRAM cells for use in connecting between multilayered metal leads in accordance with Embodiment 7 of the invention.

FIGS. 13 and 14 show an SRAM cell layout MC6 in accordance with Embodiment 7. An explanation of those symbols used in FIGS. 13-14 is the same as that given at lower part of FIG. 11. Memory cell MC6 of Embodiment 7 is similar to the memory cell MC5 of Embodiment 6 with the contacts (SC5, SC6) being replaced with contacts (SC7, SC8) in the first layer of metal lead layers (M11, M12).

With Embodiment 7, all of the contacts used therein are capable of being designed to have a square planar shape, thus avoiding the need for pattern correction (OPC).

Embodiment 8

Figure 15:
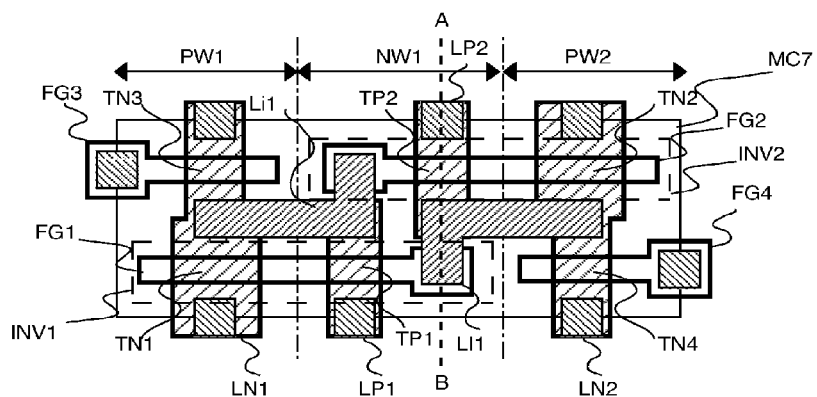
FIG. 15 is a diagram showing an SRAM cell in accordance with Embodiment 8 of the invention, for explanation of a layout of those contacts for connection between MOS transistors and those for connection between MOS transistors and metal lead layers.
Figure 16:
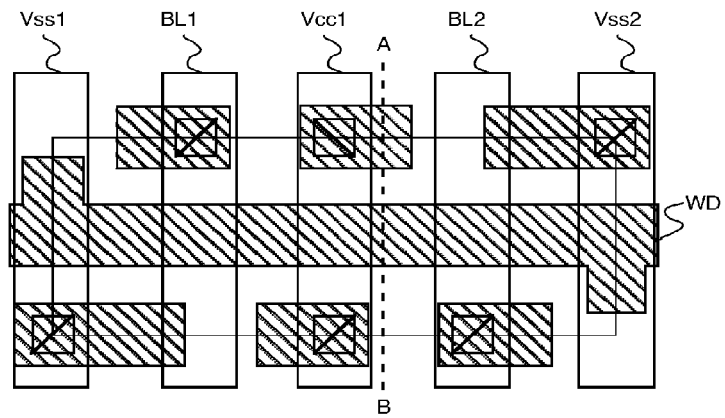
FIG. 16 is a diagram showing a layout of via holes of SRAM cells for connection between multilayered metal leads in accordance with Embodiment 8 of the invention.
Figure 17:
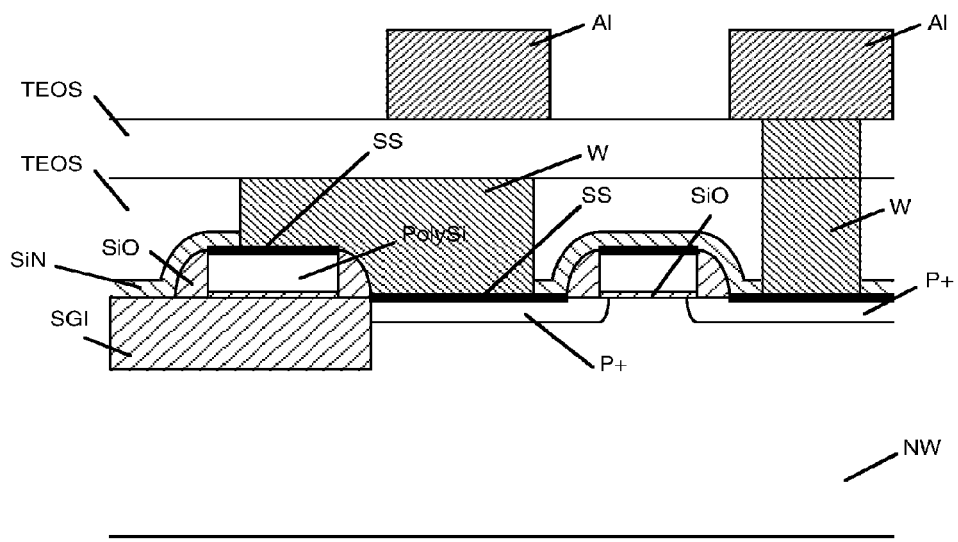
FIG. 17 is a sectional view of a semiconductor device in accordance with Embodiment 8 of the invention.

FIGS. 15 and 16 show an SRAM cell layout MC7 in accordance with Embodiment 8. An explanation of those symbols used in FIGS. 15-16 is given at lower part of FIG. 16. Memory cell MC7 of Embodiment 8 is similar to the memory cell MC of Embodiment 1 with the contacts (SC1, SC2) being replaced with local interconnect nodes (LI1, LI2) and also with the word lines being modified in such a manner that these are formed in the first layer of metal lead layer rather than in the second layer of metal lead layer while also modifying the bit lines and power supply and ground lines from the third layer of metal lead layer to the second layer of metal lead layer. FIG. 17 depicts a sectional view taken along line A-B of FIGS. 15-16.

Embodiment 1 suffers from limitations as to an inability to dispose the first layer of metal leads over the contacts SC1, SC2 due to the fact that these contacts SC1, SC2 are formed of the same layer as the remaining contacts used. In contrast, Embodiment 8 is specifically arranged to employ the local interconnect nodes LI1, LI2 formed in a separate layer from the contacts, thus making it possible to dispose the first layer of metal lead layer at upper part, which in turn makes it possible to reduce by one the requisite number of metal lead layers when compared to Embodiment 1.

Embodiment 9

A process flow of major steps in the manufacture of a three-layer contact section of Embodiment 9 is shown in FIGS. 18a-18f. This embodiment 9 is an example of the process for fabrication of the three-layer contact section as used in Embodiments 1, 3-5 and 8.

Modern LSIs in recent years are typically designed so that micropatterning is done to form contact holes by high-selectivity etching techniques with a silicon nitride film or else used as a stopper to ensure that any unwanted over-etching occurs at filed oxide films even when contacts are offset in position from diffusion layers and/or gate electrodes due to the presence of possible alignment errors during photolithographical patterning processes. In cases gate electrodes are formed to have reduced electrical resistivities by use of the so-called salicide processes, it is possible to obtain the intended electrical conduction between a contact lying over a gate electrode and a contact overlying a diffusion layer even when the both contacts are fabricated at a time because of the fact that the contact holes required are fabricated after completion of a procedure having the steps of forming silicide through exposure of selected portions overlying diffusion layers and gate electrodes after having formed such diffusion layers, depositing thereover a silicon nitride film for use as an etching stopper, and then further depositing thereover an interlayer dielectric film. On the contrary, in the case of either traditionally widely employed polycide gate electrodes or polymetal gate electrodes that have been developed and announced recently, residual portions of an insulative film such as oxide film can overlie gate electrodes thereby preventing exposure of these gate electrodes prior to deposition of a silicon nitride film acting as the etch stopper; accordingly, whenever an attempt is made to form the intended contacts through deposition of a silicon nitride film thereover, the oxide film behaves to partly reside at the bottom of a respective one of those contacts overlying the gate electrodes, which makes it impossible or at least greatly difficult to provide electrical conduction required. Embodiment 9 is for enabling achievement of electrical conduction of such contacts overlying gate electrodes by previous removal of any silicon nitride film portions overlying gate electrodes at specified part whereat contact holes will be defined.

An explanation will now be given of the process flow in the manufacture of Embodiment 9 with reference to FIGS. 18a-18f below.

Figure 18A:
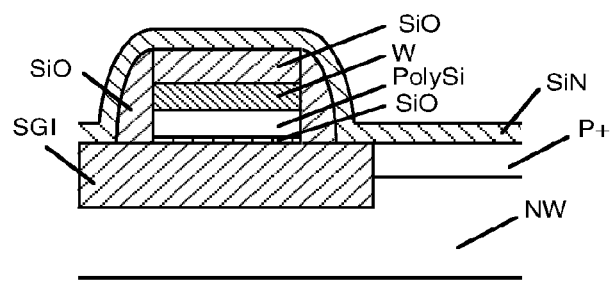
FIGS. 18a to 18f are diagrams illustrating in cross-section some of major process steps in the manufacture of a semiconductor device in accordance with Embodiment 9 of the invention.

After having fabricated a gate electrode and a diffusion layer P+, deposit a silicon nitride film SiN for use as an etch stopper (FIG. 18a). The gate electrode is a lamination of polycrystalline silicon PolySi and tungsten W, with an oxide film SiO being further multilayered thereon as a protective film.

Figure 18B:
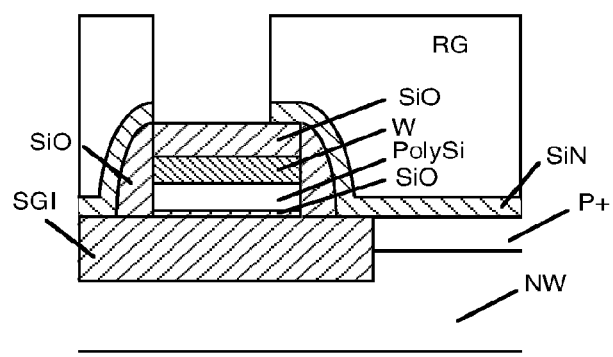

Remove by dry etching techniques specified part of the silicon nitride film at locations for definition of a contact hole overlying the gate electrode (FIG. 18b).

Figure 18C:
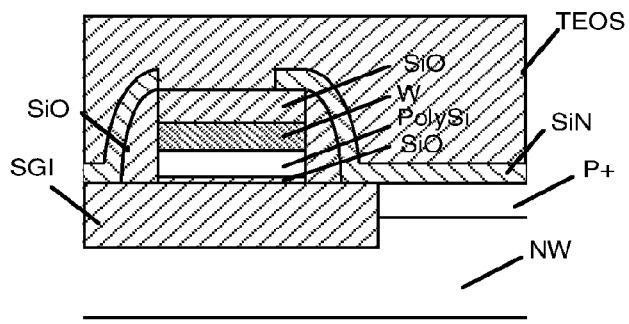

Deposit a TEOS film and others by plasma CVD methods to thereby form an interlayer dielectric film (FIG. 18c).

Figure 18D:
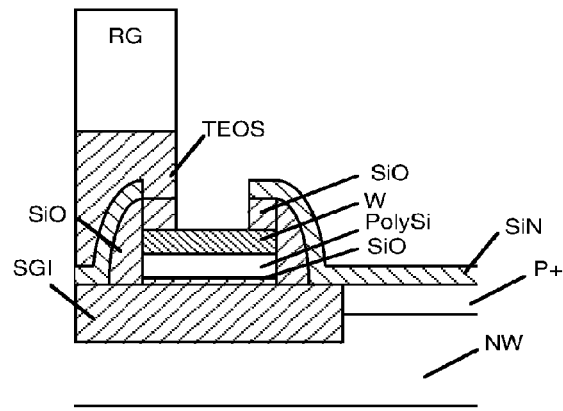

Let a selected portion of the oxide film at a contact opening portion be etched away by high selective dry etching techniques (FIG. 18d). Owing to such high selective etching, the silicon nitride film remains free from etch treatment and thus acts as a stopper. Since there is no stopper at the portion overlying the gate electrode from which the silicon nitride film has been removed away in advance, such portion will be fully etched to the upper part of the gate electrode. This permits electrical conduction on the gate electrode also.

Figure 18E:
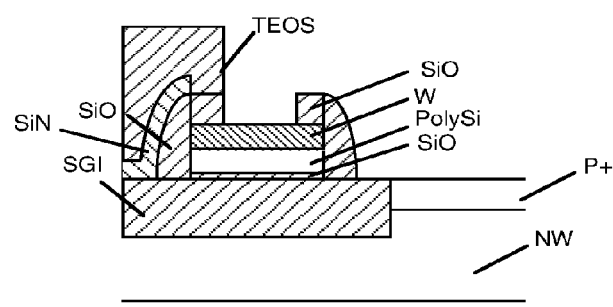

Remove the silicon nitride film by dry etching techniques (FIG. 18e).

Figure 18F:
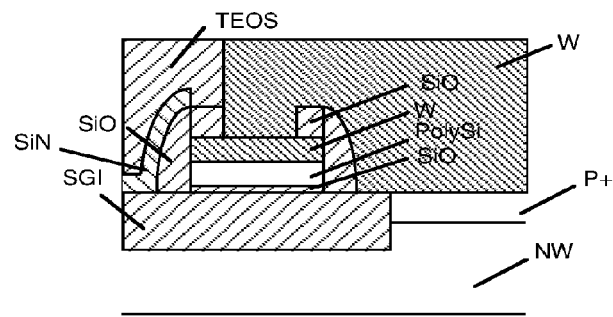

Deposit a chosen metal such as tungsten in the resulting contact hole, thereby forming a buried plug (FIG. 18f).

Embodiment 10

Turning to FIGS. 19a-19g, there is shown a process flow in the manufacture of the three-layer contact section of Embodiment 10. Embodiment 10 is one example of the process for forming the three-layer contact section of Embodiments 1, 3-5 and 8.

A difference of the process flow of Embodiment 10 from that of Embodiment 9 is that more than one portion of the oxide film at a specified location whereat a contact hole is to be opened over the gate electrode has been removed in advance prior to deposition of a silicon nitride film for use as the etch stopper.

The fabrication process flow of Embodiment 10 will be explained with reference to FIGS. 19a-19g below.

Figure 19A:
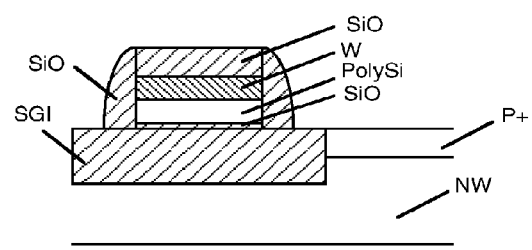
FIGS. 19a to 19g are diagrams illustrating in cross-section some of major process steps in the manufacture of a semiconductor device in accordance with Embodiment 10 of the invention.

Fabricate a gate electrode and a diffusion layer P+(FIG. 19a). The gate electrode is a lamination of polycrystalline silicon PolySi and tungsten W, with an oxide film SiO further stacked thereon as a protective film.

Figure 19B:
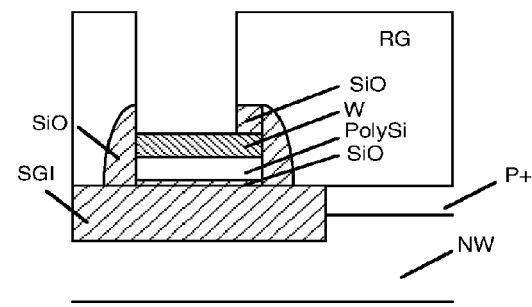

Remove by dry etching techniques a specified part of the silicon nitride film at the location for definition of a contact hole overlying the gate electrode, thus letting the gate electrode be exposed at its upper part (FIG. 19b).

Figure 19C:
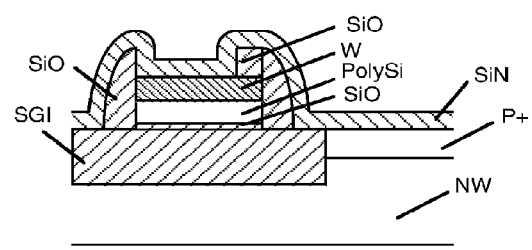

Deposit a silicon nitride film SiN as an etch stopper (FIG. 19c).

Figure 19D:
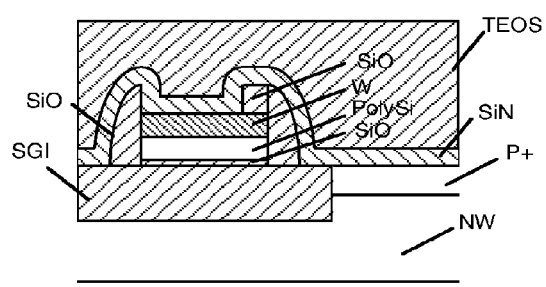

Deposit a TEOS film or else by plasma CVD methods to thereby form an interlayer dielectric film (FIG. 19d).

Figure 19E:
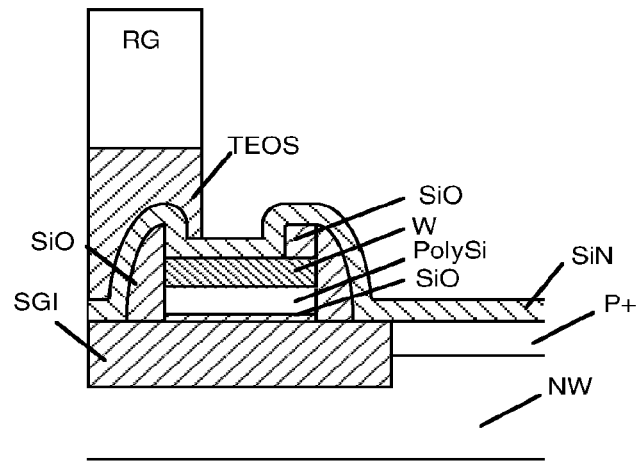

Let a portion of the oxide film at contact opening portion be etched away by high selective dry etching techniques (FIG. 19e). Due to such high selective etching, the silicon nitride film remains free from etching treatment and thus acts as the stopper.

Figure 19F:
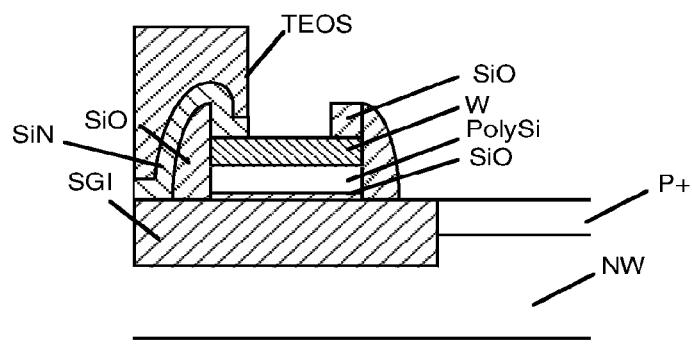

Remove the silicon nitride film by dry etching techniques (FIG. 19f). A certain portion from which the oxide film overlying the gate electrode has been removed prior to deposition of the silicon nitride film is thus exposed at this time, which permits electrical conduction on the gate electrode also.

Figure 19G:
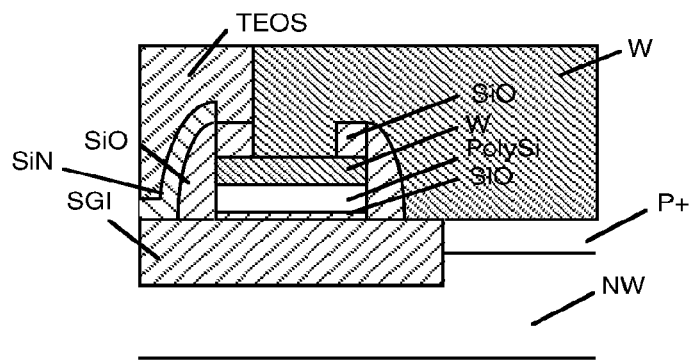

Deposit a chosen metal such as tungsten in the resultant contact hole, thereby forming a buried plug (FIG. 19g).

In accordance with the embodiments stated above, any diffusion layers used therein are specifically designed to have a simplified planar shape excluding unnecessarily complicated shapes, which may in turn facilitate micro-patterning processes.

The invention claimed is:

1. A semiconductor integrated circuit device comprising:
a first N-well region provided on a main surface of a semiconductor substrate and extending in a first direction;
a first P-well region and a second P-well region which are formed on the main surface of the semiconductor substrate at first and second sides respectively of the first N-well region in a plan view, the first and second P-well regions extending longitudinally in the first direction, the first N-well region and the first and second P-well regions being continuously extended on a first region and a second region of the semiconductor substrate in the plan view, the first region and the second region being at different positions along the first direction, with the entirety of the second region being disposed to one side of the first region in the first direction such that, in the plan view, the second region has no overlap with the first region and no portion of the second region is adjacent to the first region in a second direction substantially perpendicular to the first direction;
an SRAM cell formed on the main surface of the semiconductor substrate in the first region, the SRAM cell including:
a first inverter comprising a first N-channel transistor and a first P-channel transistor which are series connected to each other,
a second inverter comprising a second N-channel transistor and a second P-channel transistor which are series connected to each other, the first and second inverters being cross-coupled to each other;
a third N-channel transistor as a first transfer transistor coupled to an output of the first inverter; and
a fourth N-channel transistor as a second transfer transistor coupled to an output of the second inverter;
a word line formed over the main surface of the semiconductor substrate and extending longitudinally in the second direction in the plan view, the word line being coupled to gate electrodes of the third and fourth N-channel transistors; and
a first bit line and a second bit line formed over the main surface of the semiconductor substrate and extending longitudinally in the first direction, each of the first and second bit lines being coupled to a respective one of source and drain regions of the third and fourth N-channel transistors;
wherein the first and third N-channel transistors have a first diffusion layer which is formed in the first P-well region and forms source and drain regions and channel regions,
wherein the first diffusion layer extends longitudinally along the first direction across gate electrodes of the first and third N-channel transistors in the plan view,
wherein a first contact for supplying a source potential to the first N-channel transistor is disposed on the first diffusion layer at one side of the gate electrode of the first N-channel transistor,
wherein a second contact for providing an electrical connection between the first bit line and the third N-channel transistor is disposed on the first diffusion layer at one side of the gate electrode of the third N-channel transistor, and
wherein the first and second contacts are arranged in a substantially straight line along the first direction in the plan view,
wherein, in the plan view, no memory cell is formed in the second region,
wherein a first well contact for supplying a first well voltage to the first P-well region is disposed on the first P-well region at the second region in the plan view, and no well contact for supplying the first well voltage to the first P-well region is disposed on the first P-well region at the first region in the plan view, and
wherein the first diffusion layer has no bent portion with another contact disposed thereon in the plan view.

2. A semiconductor integrated circuit device according to claim 1, further comprising a second well contact for supplying the first well voltage to the second P-well region and a third contact for supplying a second well voltage to the first N-well region,
wherein the second well contact is disposed on the second P-well region at the second region in the plan view, and no well contact for supplying the first well voltage to the second P-well region is disposed on the second P-well region at the first region in the plan view, and wherein the third well contact is disposed on the first N-well region at the second region in the plan view, and no well contact for supplying the second well voltage to the first N-well region is disposed on the first N-well region at the first region in the plan view.

3. A semiconductor integrated circuit device according to claim 2, wherein each of the gate electrodes of the first and third N-channel transistors is extended in the second direction without bending along the first direction in the plan view.

4. A semiconductor integrated circuit device according to claim 3, wherein a channel width of the first N-channel transistor is wider than a channel width of the third N-channel transistor, and wherein the channel widths of the first and third N-channel transistors are defined by a width of the first diffusion layer in the second direction.

5. A semiconductor integrated circuit device according to claim 1, wherein a configuration of the first diffusion layer in the plan view is defined by a field region formed on the main surface of the semiconductor substrate.

6. A semiconductor integrated circuit device according to claim 5, wherein the field region comprises a field oxide film.

7. A semiconductor integrated circuit device according to claim 2, wherein the first P-channel transistor has a second diffusion layer which is formed in the first N-well region and forms source and drain regions and a channel region,
wherein the second diffusion layer extends along the first direction across a gate electrode of the first P-channel transistor in the plan view,
wherein the gate electrodes of the first P-channel transistor and the first N-channel transistor are formed of a first common conductive layer continuously extending over portions of the first N-well region and the first P-well region.

8. A semiconductor integrated circuit device according to claim 7, wherein the gate electrodes of the first P-channel transistor and the first N-channel transistor are formed of a polycrystalline silicon layer.

9. A semiconductor integrated circuit device according to claim 2, wherein a voltage level of the first well voltage is lower than that of the second well voltage, and wherein the voltage level of the first well voltage is substantially the same as that of a source potential.

10. A semiconductor integrated circuit device comprising:
a first N-well region provided on a main surface of a semiconductor substrate and extending longitudinally in a first direction;
a first P-well region and a second P-well region which are formed on the main surface of the semiconductor substrate at first and second sides respectively of the first N-well region in a plan view, the first and second P-well regions extending longitudinally in the first direction, the first N-well region and the first and second P-well regions being continuously extended on a first region and a second region of the semiconductor substrate in the plan view, the first region and the second region being at different positions along the first direction, with the entirety of the second region being disposed to one side of the first region in the first direction such that, in the plan view, the second region has no overlap with the first region and no portion of the second region is adjacent to the first region in a second direction substantially perpendicular to the first direction;
an SRAM cell formed on the main surface of the semiconductor substrate in the first region, the SRAM cell including:
a first inverter comprising a first N-channel transistor and a first P-channel transistor which are series connected to each other,
a second inverter comprising a second N-channel transistor and a second P-channel transistor which are series connected to each other, the first and second inverters being cross-coupled to each other;
a third N-channel transistor as a first transfer transistor coupled to an output of the first inverter; and
a fourth N-channel transistor as a second transfer transistor coupled to an output of the second inverter;
a word line formed over the main surface of the semiconductor substrate and extending longitudinally in the second direction in the plan view, the word line being coupled to gate electrodes of the third and fourth N-channel transistors; and
a first bit line and a second bit line formed over the main surface of the semiconductor substrate and extending longitudinally in the first direction, each of the first and second bit lines being coupled to a respective one of source and drain regions of the third and fourth N-channel transistors;
wherein the first and third N-channel transistors have a first diffusion layer which is formed in the first P-well region and forms source and drain regions and channel regions,
wherein the first diffusion layer extends longitudinally along the first direction across gate electrodes of the first and third N-channel transistors in the plan view,
wherein a first contact for supplying a source potential to the first N-channel transistor is disposed on the first diffusion layer at one side of the gate electrode of the first N-channel transistor,
wherein a second contact for providing an electrical connection between the first bit line and the third N-channel transistor is disposed on the first diffusion layer at one side of the gate electrode of the third N-channel transistor, and
wherein the first and second contacts are arranged in a substantially straight line along the first direction in the plan view,
wherein the second and fourth N-channel transistors have a second diffusion layer which is formed in the second P-well region and forms source and drain regions and channel regions,
wherein the second diffusion layer extends longitudinally along the first direction across gate electrodes of the second and fourth N-channel transistors in the plan view,
wherein a third contact for providing a source potential to the second N-channel transistor is disposed on the second diffusion layer at one side of the gate electrode of the second N-channel transistor,
wherein a fourth contact for providing an electrical connection between the second bit line and the fourth N-channel transistor is disposed on the second diffusion layer at one side of the gate electrode of the fourth N-channel transistor, and
wherein the third and fourth contacts are arranged in a substantially straight line along the first direction in the plan view,
wherein, in the plan view, no memory cell is formed in the second region, wherein a first well contact and a second well contact for supplying a first well voltage to the first and second P-well regions are disposed on the first and second P-well regions respectively at the second region in the plan view, no well contact for supplying the first well voltage to the first P-well region is disposed on the first P-well region at the first region in the plan view, and no well contact for supplying the first well voltage to the second P-well region is disposed on the second P-well region at the first region in the plan view, wherein a third well contact for supplying a second well voltage to the first N-well region is disposed on the first N-well region at the second region in the plan view, and no well contact for supplying the second well voltage to the first N-well region is disposed on the first N-well region at the first region in the plan view, wherein each of the first and second diffusion layers has no bent portion with another contact disposed thereon in the plan view, and wherein a voltage level of the first well voltage is lower than that of the second well voltage, and wherein the voltage level of the first well voltage is substantially the same as that of a source potential.

* * * * *